(12) United States Patent
Jung et al.

(10) Patent No.: US 9,706,649 B2
(45) Date of Patent: Jul. 11, 2017

(54) PLASTIC SUBSTRATE, METHOD FOR PRODUCING THE SAME AND TOUCH SCREEN PANEL CONTAINING THE SAME

(71) Applicant: KOLON INDUSTRIES, INC., Gwacheon-si, Gyeonggi-do (KR)

(72) Inventors: Hak Gee Jung, Yongin-si (KR); Hyo Jun Park, Yongin-si (KR); Chul Ha Ju, Yongin-si (KR)

(73) Assignee: KOLON INDUSTRIES, INC., Gwacheon-si (KR)

( * ) Notice: Subject to any disclaimer, the term of this patent is extended or adjusted under 35 U.S.C. 154(b) by 124 days.

(21) Appl. No.: 14/368,998

(22) PCT Filed: Dec. 26, 2012

(86) PCT No.: PCT/KR2012/011459
§ 371 (c)(1),
(2) Date: Jun. 26, 2014

(87) PCT Pub. No.: WO2013/100557
PCT Pub. Date: Jul. 4, 2013

(65) Prior Publication Data
US 2014/0338959 A1    Nov. 20, 2014

(30) Foreign Application Priority Data

Dec. 26, 2011 (KR) .................. 10-2011-0142075

(51) Int. Cl.
*H05K 1/00* (2006.01)
*H05K 1/03* (2006.01)
(Continued)

(52) U.S. Cl.
CPC .............. *H05K 1/0353* (2013.01); *C08J 5/18* (2013.01); *C08J 7/045* (2013.01); *G06F 3/041* (2013.01);
(Continued)

(58) Field of Classification Search
CPC H05K 1/0353; C08J 5/18; C08J 7/045; G06F 3/041; H01B 3/30
(Continued)

(56) References Cited

U.S. PATENT DOCUMENTS

2004/0265602 A1  12/2004 Kobayashi et al.
2010/0255221 A1  10/2010 Jung et al.
(Continued)

FOREIGN PATENT DOCUMENTS

KR  10-2009-0019306 A   2/2009
KR  10-2009-0021591 A   3/2009
(Continued)

OTHER PUBLICATIONS

International Searching Authority, International Search Report of PCT/KR2012/011459 dated Mar. 21, 2013.

*Primary Examiner* — Tremesha S Willis
(74) *Attorney, Agent, or Firm* — Sughrue Mion, PLLC

(57) ABSTRACT

The present invention provides a plastic substrate, including: a polyimide film; a hard coating layer formed on one side of the polyimide film; and a transparent electrode layer formed on the other side of the polyimide film. The plastic substrate has excellent light transmittance high hardness characteristics, superior ITO processability and flexibility. Further, the plastic substrate can function as both a window film and an electrode film when it is applied to a touch screen panel. Thus, the present invention provides a touch screen panel which can be slimmed by reducing the number of laminated films including the plastic substrate.

22 Claims, 1 Drawing Sheet

(51) Int. Cl.
*G06F 3/041* (2006.01)
*H01B 3/30* (2006.01)
*H05K 1/02* (2006.01)
*H05K 1/09* (2006.01)
*C08J 5/18* (2006.01)
*C08J 7/04* (2006.01)

(52) U.S. Cl.
CPC ............... *H01B 3/30* (2013.01); *H01B 3/306* (2013.01); *H05K 1/0274* (2013.01); *H05K 1/092* (2013.01); *C08J 2379/08* (2013.01); *C08J 2433/06* (2013.01); *C08J 2475/04* (2013.01); *C08J 2483/16* (2013.01)

(58) Field of Classification Search
USPC ................................ 174/253, 250, 255–258
See application file for complete search history.

(56) References Cited

U.S. PATENT DOCUMENTS

| | | |
|---|---|---|
| 2011/0143132 A1 | 6/2011 | Jung et al. |
| 2011/0311796 A1 | 12/2011 | Jung et al. |

FOREIGN PATENT DOCUMENTS

| | | |
|---|---|---|
| KR | 10-0905478 B1 | 7/2009 |
| KR | 10-2010-0034100 A | 4/2010 |
| KR | 10-2011-0000195 A | 1/2011 |

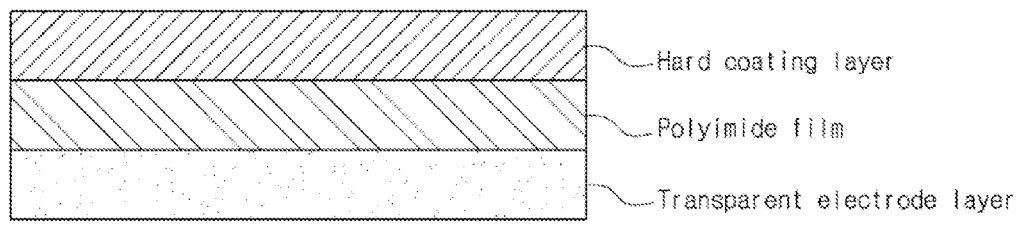

PLASTIC SUBSTRATE, METHOD FOR PRODUCING THE SAME AND TOUCH SCREEN PANEL CONTAINING THE SAME

CROSS REFERENCE TO RELATED APPLICATIONS

This is a National Stage of International Application No. PCT/KR2012/011459 filed Dec. 26, 2012, claiming priority based on Korean Patent Application No. 10-2011-0142075 filed Dec. 26, 2011, the contents of all of which are incorporated herein by reference in their entirety.

TECHNICAL FIELD

The present invention relates to a plastic substrate and a touch screen panel including the same.

BACKGROUND ART

Recently, in displays, conventional cathode ray tubes (CRTS) have been converted into flat panel displays, such a plasma display panel (PDP), a liquid crystal display (LCD), an organic light emitting diode (OLED) and the like. Particularly, in order to realize such flat panel displays into flexible displays in the future, research thereinto is going on all over the world.

In such a flat panel display, basically, a substrate is made of a glass material. Meanwhile, in a general flat panel display, high-temperature heat treatment is required to form a thin film transistor (TFT), and thus a glass substrate has been used as the most suitable substrate therefore.

However, the glass substrate is problematic in that it is not suitable as a substrate for flexible displays because it is excessively rigid, that is to say, its flexibility is poor.

Therefore, research into technologies of manufacturing a substrate for flexible displays using a plastic material, wherein the substrate for flexible displays is superior to a glass substrate in terms of formability, durability, design and the like, and particularly, can be produced through a roll to roll method so as to reduce the production cost thereof, has actively been conducted. However, such a substrate for flexible displays, made of a plastic material, has not been developed yet to such a degree that it is commercially available.

Meanwhile, touch screen panels (TSPs) are used in flat panel displays, such as electronic notepads, liquid crystal displays (LCDs), plasma display panels (PDPs), electroluminescent panels, and cathode ray tubes (CRTs), and are intended to allow a user to select desired information through such displays. Touch screen panels (TSPs) are largely classified into resistive type touch screen panels, capacitive type touch screen panels and resistive-multi-touch type touch screen panels.

Such a resistive type touch screen panel is made by applying a resistive material onto a glass or plastic substrate and then covering the substrate with a polyethylene film, and is configured such that insulation rods are provided at regular intervals to prevent the two faces from coming into contact with each other. The operating principle thereof is as follows. When predetermined electric current is applied to both ends of a resistive film, the resistive film acts as a resistor, and thus voltage is generated between both ends thereof. When a user's finger comes into contact with the resistive type touch screen panel, the polyester film formed on the upper surface of the substrate warps, and thus the two faces are connected to each other. Therefore, owing to the resistive components of the two faces, the two faces are disposed in the form of a parallel connection of resistors, and the change in a resistance value occurs. In this case, voltage is changed by electric current flowing through both ends of the resistive film, and the position of the finger making contact with this touch screen panel can be recognized by the degree of change in voltage. This resistive type touch screen panel is advantageous in that it has high resolution and rapid response speed because it is operated by surface pressure, but is disadvantageous in that it can activate only one point and is in danger of being damaged.

Further, such a capacitive type touch screen panel is made by applying a special conductive metal to both sides of heat-treated glass. When voltage is applied to the four edges of the touch screen panel, high frequency waves spread to the entire surface of a sensor. At this time, when a user's finger comes into contact with this touch screen panel, the flow of electrons is changed, and such a change is detected, thus recognizing coordinates. This capacitive type touch screen panel is advantageous in that it can be activated by simultaneously pushing several points and has high resolution and excellent durability, but is disadvantageous in that it has a low response speed and is difficult to mount.

Finally, such a resistive-multi-touch type touch screen panel is realized such that it can be activated in the same manner as in the capacitive type touch screen panel by making up for the worst disadvantage of the resistive type touch screen panel capable of activating only one point.

Meanwhile, touch screen panels (TSPs) are selected for individual electronic products in consideration of their respective characteristics, such as optical characteristics, electrical characteristics, mechanical characteristics, environment-resistant characteristics, input characteristics, durability and economical efficiency, as well as signal amplification problems, resolution differences and degree of difficulty in a processing technology. Particularly, resistive type and capacitive type touch screen panels are widely used in electronic notepads, personal digital assistants (PDAs), portable PCs, mobile phones and the like.

In the technology of manufacturing a touch screen, in the future, it will required to reduce the thickness of a touch screen panel in order for the touch screen panel to have sufficient durability while simplifying complicated processes as much as possible. The reason for this is that, even when the brightness of a display is lowered by increasing light transmittance, the same performance as that of the existing product is realized, and thus power consumption can be reduced, thereby increasing the life time of a battery.

There has been proposed a general resistive type touch screen panel.

Explaining the general resistive type touch screen panel, this resistive type touch screen panel includes: a window film (or overlay film) provided on one side of a liquid crystal display device; and first/second ITO films attached to the lower surface of the window film and provided to electrically input information to a liquid crystal display module, wherein the window film is provided to protect the first ITO film. The window film (or overly film) is generally made of polyethylene terephthalate (PET), and the first ITO film is attached to the window film (or overly film) by an optical clear adhesive (OCA). The first and second ITO films are printed on the edges thereof with first and second electrode layers made of silver, respectively. Here, a double-sided tape for insulation is provided between the first and second electrode layers, and the first and second electrode layers are spaced from each other at a predetermined interval by a dot spacer, so these first and second electrode layers are electrically connected with each other when external pressure (touch) is applied by a finger or a touch pen, thereby detecting an accurate touch position.

In this case, this resistive type touch screen panel is problematic in that its light transmittance is deteriorated due to a lamination process of attaching the first ITO film to the window film (or overlay film) using an optical clear adhesive (OCA), and in that processing treatment becomes complicated and processing cost increases because a process of disposing the window film (or overlay film) and a process of attaching the first ITO film to the window film (or overlay film) using the optical clear adhesive (OCA) must be separately carried out.

Further, this resistive type touch screen panel is problematic in that ITO cannot be selectively applied onto the desired region of the window film (or PET film) because the ITO film is patterned by wet etching using laser.

Generally, in the manufacture of a touch screen, a polyethylene terephthalate (PET) film is used as a transparent substrate. However, the PET film is advantageous in terms of a cost, but is disadvantageous in that it has low heat resistance to such a degree that it is deformed at 130° C. or higher.

Therefore, when a subsequent heat treatment process is carried out with a PET film deposited with an indium tin oxide (ITO) film, the PET film is expanded or contracted, thus causing the ITO film to become loose or to be cracked. In order to prevent such an undesirable phenomenon, a method of carrying out a subsequent process after a primary process of previously exposing a transparent substrate to high temperature for a long period has recently been used.

However, this method is also problematic in that such a pretreatment process serves to increase the time taken to manufacture a touch screen, thus decreasing the production rate thereof.

BRIEF DESCRIPTION OF DRAWINGS

Exemplary embodiments are illustrated in the referenced figures of the drawings. It is intended that the embodiments and the figures disclosed herein are to be considered illustrative rather than limiting.

The FIGURE is a schematic cross sectional view of an exemplary embodiment of the inventive plastic substrate.

DISCLOSURE

Technical Problem

The present invention intends to provide a plastic substrate having excellent light transmittance and satisfying high hardness characteristics, ITO processability, and flexibility.

The present invention intends to provide a plastic substrate which can function as both a window film and an electrode film.

The present invention intends to provide a touch screen panel which can be slimmed by reducing the number of laminated films including the plastic substrate.

Technical Solution

An aspect of the present invention provides a plastic substrate, including: a polyimide film including imides of polyimide resin precursors prepared by polymerization of dianhydrides and diamines or polymerization of dianhydrides, aromatic dicarbonyl compounds and diamines, having a yellowness of 5 or less and satisfying a light transmittance of 80% or more at a wavelength of 550 nm, measured by a UV spectrometer; a hard coating layer formed on one side of the polyimide film; and a transparent electrode layer formed on the other side of the polyimide film.

Here, the hard coating layer may be formed of an organic-inorganic hybrid hard coat composition including polysilazane or silica and acrylic resin or polyurethane resin.

Further, the transparent electrode layer may include at least one selected from among ITO, IZO, Ag and Ag nanowire.

Further, the polyimide film may be surface-modified, and the surface modification of the polyimide film may be conducted by plasma treatment or corona treatment.

The plastic substrate may further include: an inorganic layer formed between the polyimide film and the transparent electrode layer and containing at least one selected from among silicon oxide and silicon nitride.

The plastic substrate may further include: an organic layer formed on at least one side of the transparent electrode layer, wherein the organic layer is a cured layer of an active energy ray-curable composition including: polyurethane (meth) acrylate obtained by reacting a (meth)acrylate compound containing (meth)acrylate having one hydroxyl group in one molecule thereof; and a compound having one (meth)acryloyl group.

The organic layer may be formed on the hard coating layer.

The hard coating layer may be formed between the polyimide film and the transparent electrode layer.

The hard coating layer may have a thickness of 1~50 μm. The transparent electrode layer may have a thickness of 1~100 nm.

The inorganic layer may have a thickness of 1~100 nm.

The polyimide film may include a polyimide resin including: a unit structure derived from at least one aromatic dianhydride selected from among 2,2-bis(3,4-dicarboxyphenyl)hexafluoropropane dianhydride (FDA), 4-(2,5-dioxotetrahydrofuran-3-yl)-1,2,3,4-tetrahydronaphthalene-1,2-dicarboxylic anhydride (TDA), 9,9-bis(trifluoromethyl)-2,3,6, 7-xanthene tetracarboxyl dianhydride (6FCDA) and 4,4'-(4, 4'-isoproylidenediphenoxy)bis(phthalic anhydride) (HBDA), and at least one aromatic dianhydride selected from among pyromellitic dianhydride (PMDA), biphenyltetracarboxylic dianhydride (BPDA) and oxydiphthalic dianhydride (ODPA); and a unit structure derived from at least one aromatic diamine selected from among 2,2-bis[4-(4-aminophenoxy)-phenyl]propane (6HMDA), 2,2'-bis(trifluoromethyl)-4,4'-diaminobiphenyl (2,2-TFDB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (ODDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F) and oxydianiline (ODA), or the polyimide film may include a polyimide resin including: a unit structure derived from the aromatic dianhydride; a unit structure derived from at least one aromatic dicarbonyl compound selected from among p-terephthaloyl chloride (TPC), terephthalic acid, iso-phthaloyl dichloride and 4,4'-benzoyl chloride; and a unit structure derived from the aromatic diamine.

The polyimide film may have an average linear expansion coefficient of 30.0 ppm/° C. or less, which was measured at a temperature range of 50~250° C. by thermo-mechanical analysis based on a thickness of 50~200 μm.

The plastic substrate may have a surface resistance of 50 Ω/sq. or less, when the thickness of the transparent electrode layer is 100 nm, thus realizing low resistance.

Another aspect of the present invention provides a method of manufacturing a plastic substrate, including the steps of: forming a hard coating layer on one side of a polyimide film including imides of polyimide resin precursors prepared by polymerization of dianhydrides and diamines or polymerization of dianhydrides, aromatic dicarbonyl compounds and diamines, having a yellowness of 5 or less and satisfying a light transmittance of 80% or more at a wavelength of 550 nm, measured by a UV spectrometer; and forming a transparent electrode layer on the other side of the polyimide film, wherein the step of forming the transparent electrode layer includes the step of depositing the transparent electrode layer on the other side of the polyimide film and heat-treating the deposited transparent electrode layer, wherein the deposition or heat treatment is performed at 100 to 250° C.

Advantageous Effects

According to the plastic substrate of the present invention, it does not cause deformation such as yellowing even during an ITO process, can exhibit high hardness characteristics even though it is thin, and it can realize low surface resistance. Therefore, for example, when it is applied to a touch screen panel, the structure of the touch screen panel can be simplified.

BEST MODE

Referring to the FIGURE, the plastic substrate according to an embodiment of the present invention includes: a polyimide film including imides of polyimide resin precursors prepared by polymerization of dianhydrides and diamines or polymerization of dianhydrides, aromatic dicarbonyl compounds and dimaines, having a yellowness of 5 or less and satisfying a light transmittance of 80% or more at a wavelength of 550 nm, measured by a UV spectrometer; a hard coating layer formed on one side of the polyimide film; and a transparent electrode layer formed on the other side of the polyimide film. Here, the hard coating layer is a layer for imparting high hardness to the plastic substrate. Thanks to the hard coating layer, a window film is not required at the time of forming a touch screen panel. Further, the hard coating layer can improve the chemical resistance of the plastic substrate together with the following organic layer. For example, the hard coating layer can improve the chemical resistance of the plastic substrate to such a degree that the plastic substrate is not changed when it is observed by the naked eye after it is dipped into an organic solvent such as tetramethylammonium hydroxide, magnesium sulfate, potassium hydroxide, N-methyl-2-pyrrolidone or methyl ethyl ketone.

According to the plastic substrate of the present invention, the light transmittance of the polyimide film may be 88% or more at a wavelength of 550 nm and 70% or more at a wavelength of 440 nm, as measured by a UV spectrometer based on its thickness of 50~200 μm.

The polyimide film satisfying the above yellowness and light transmittance can be used in the fields of optical windows and transmissive displays requiring transparency, the usage of which has been limited due to the yellow color of a conventional polyimide film, and can be used for flexible display substrates.

According to an embodiment of the present invention, the hard coating layer may be formed of an organic-inorganic hybrid hard coat composition including polysilazane or silica and acrylic resin or polyurethane resin.

According to an embodiment of the present invention, the transparent electrode layer may include at least one selected from among ITO, IZO, Ag and Ag nanowire.

According to an embodiment of the present invention, the polyimide film may be surface-modified, and the surface modification of the polyimide film may be conducted by plasma treatment or corona treatment. Thanks to the surface modification of the polyimide film, the surface adhesivity of the polyimide film to other various layers exemplified in the present invention can be improved, thus further improving the light transmittance, surface hardness and moisture permeability of the plastic substrate.

According to an embodiment of the present invention, the plastic substrate may further include: an inorganic layer formed between the polyimide film and the transparent electrode layer and containing at least one selected from among silicon oxide and silicon nitride.

Further, according to an embodiment of the present invention, the plastic substrate may further include: an organic layer formed on at least one side of the transparent electrode layer, wherein the organic layer is a cured layer of an active energy ray-curable composition including: polyurethane (meth)acrylate obtained by reacting a (meth)acrylate compound containing (meth)acrylate having one hydroxyl group in one molecule thereof; and a compound having one (meth)acryloyl group.

This organic layer may be formed on the hard coating layer.

The hard coating layer may be formed between the polyimide film and the transparent electrode layer.

According to an embodiment of the present invention, the hard coating layer may have a thickness of 1~50 μm.

According to an embodiment of the present invention, the transparent electrode layer may have a thickness of 1~100 nm.

According to an embodiment of the present invention, the inorganic layer may have a thickness of 10~100 nm.

According to an embodiment of the present invention, the polyimide film may include a polyimide resin including: a unit structure derived from at least one aromatic dianhydride selected from among 2,2-bis(3,4-dicarboxyphenyl)hexafluoropropane dianhydride (FDA), 4-(2,5-dioxotetrahydrofuran-3-yl)-1,2,3,4-tetrahydronaphthalene-1,2-dicarboxylic anhydride (TDA), 9,9-bis(trifluoromethyl)-2,3,6,7-xanthene tetracarboxyl dianhydride (6FCDA) and 4,4'-(4,4'-isoproylidenediphenoxy)bis(phthalic anhydride) (HBDA), and at least one aromatic dianhydride selected from among pyromellitic dianhydride (PMDA), biphenyltetracarboxylic dianhydride (BPDA) and oxydiphthalic dianhydride (ODPA); and a unit structure derived from at least one aromatic diamine selected from among 2,2-bis[4-(4-aminophenoxy)-phenyl]propane (6HMDA), 2,2'-bis(trifluoromethyl)-4,4'-diaminobiphenyl (2,2-TFDB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (ODDS), 1,3-bis(3-aminophenoxy)benzene (APB-133), 1,4-bis(4-aminophenoxy)benzene (APB-134), 2,2'-bis[3-(3-aminophenoxy)phenyl]hexafluoropropane (3-BDAF), 2,2'-bis[4(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F) and oxydianiline (ODA), or the polyimide film may include a polyimide resin including: a unit structure derived from the aromatic dianhydride; a unit structure derived from at least one aromatic dicarbonyl compound selected from among p-terephthaloyl chloride (TPC), terephthalic acid, iso-phthaloyl dichloride and 4,4'-benzoyl chloride; and a unit structure derived from the aromatic diamine.

According to an embodiment of the present invention, the polyimide film may have an average linear expansion coefficient (CTE) of 30.0 ppm/° C. or less, which was measured at a temperature range of 50~250° C. by thermo-mechanical analysis based on a thickness of 50~200 µm.

The plastic substrate of the present invention may be used in a substrate for forming a color filter, an OLED TFT substrate, a substrate for PV, an upper electrode substrate and the like. In this case, a process of forming a transparent electrode layer on a polyimide film, referred to as an ITO process, must be conducted. Therefore, when the linear expansion coefficient of the polyimide film is high, the polyimide film is extended by the linear expansion coefficient thereof during a high-temperature ITO process, and is then contracted again during a cooling process at room temperature. In this case, when the difference in expansion or contraction between the polyimide film and electrode material increases, the polyimide film is damaged, and the performance of a device is deteriorated. Therefore, it is preferred that the linear expansion coefficient of the polyimide film be low. Considering these points, in the plastic substrate of the present invention, it is preferred that the average linear expansion coefficient of the polyimide film be 30.0 ppm/° C. or less, which was measured at a temperature range of 50~250° C. by thermo-mechanical analysis based on a thickness of 50~200 µm.

The plastic substrate of the present invention may have a surface resistance of 50 Ω/sq. or less, when the thickness of the transparent electrode layer is 100 nm, thus realizing low resistance.

The method of manufacturing a plastic substrate according to another embodiment of the present invention includes the steps of: forming a hard coating layer on one side of a polyimide film including imides of polyimide resin precursors prepared by polymerization of dianhydrides and diamines or polymerization of dianhydrides, aromatic dicarbonyl compounds and diamines, having a yellowness of 5 or less and satisfying a light transmittance of 80% or more at a wavelength of 550 nm, measured by a UV spectrometer; and forming a transparent electrode layer on the other side of the polyimide film, wherein the step of forming the transparent electrode layer includes the step of depositing the transparent electrode layer on the other side of the polyimide film and heat-treating the deposited transparent electrode layer, wherein the deposition or heat treatment is performed at 100 to 250° C.

According to the plastic substrate satisfying the above-mentioned structural characteristics, a process of forming a transparent electrode layer can be performed under high temperature, thus providing a plastic substrate having a lower resistance.

MODE FOR INVENTION

Hereinafter, the present invention will be described in more detail with reference to the following Examples.

Examples 1 to 3

As a reactor, a 100 mL 3-neck round-bottom flask provided with a stirrer, a nitrogen injector, a dropping funnel, a temperature controller and a cooler was filled with 28.78 g of N,N-dimethylacetamide (DMAc) while supplying nitrogen, and then cooled to 0° C., and then 3.2023 g (0.01 mol) of 2,2-TFDB was dissolved in DMAc to prepare a solution, and then this solution was maintained at 0° C. Then, 0.88266 g (0.003 mol) of BPDA was added to the solution and stirred for 1 hour to completely dissolve BPDA, and then 3.10975 g (0.007 mol) of 6FDA was added and completely dissolved. In this case, the concentration of solid matter in the resultant solution was 20 wt %. Thereafter, this solution was stirred at room temperature for 8 hours to obtain a polyamic acid solution having a solution viscosity of 2100 poise at 23° C.

Subsequently, 2~4 equivalents of acetic anhydride (acetic oxide, manufactured by Samjeon Co., Ltd.), as a curing agent, and 2~4 equivalents of pyridine (manufactured by Samjeon Co., Ltd.) were added to the polyamic acid solution, and then this polyamic acid solution was heated in a temperature range of 20~180° C. at a heating rate of 10° C./min for 1~10 hours to imidize the polyamic acid solution. Then, 30 g of this imidized solution was mixed with 300 g of a nonpolar solvent such as water or alcohol (methanol, ethanol or the like) and then precipitated to obtain a solid precipitate. Then, the solid precipitate was filtered and pulverized to be finely powdered, and then the finely-powdered precipitate was dried in a vacuum oven at 80~100° C. for 6 hours to obtain about 8 g of solid polyimide resin powder. The obtained solid polyimide resin powder was dissolved in 32 g of a polymerization solvent such as DMAc or DMF to obtain a polyimide solution. This polyimide solution was heated in a temperature range of 40~400° C. at a heating rate of 10° C./min for 1~8 hours to obtain a polyimide film having a thickness of 100 µm.

Then, an organic-inorganic hybrid hard coat composition including polysilazane or silica and acrylic resin or urethane resin was applied to one side of the obtained polyimide film (serving as a substrate) to form a hard coating layer.

Next, an ITO electrode layer was formed by depositing the other side of the polyimide film with ITO using sputtering and then heat-treating this polyimide film using rapid thermal annealing (RTA).

The thicknesses of the hard coating layers and ITO electrode layers obtained in Examples 1 to 3 depending on the change of process temperature are summarized in Table 1 below.

Example 4

As a reactor, a 100 mL 3-neck round-bottom flask provided with a stirrer, a nitrogen injector, a dropping funnel, a temperature controller and a cooler was filled with 28.78 g of N,N-dimethylacetamide (DMAc) while supplying nitrogen, and then cooled to 0° C., and then 3.2023 g (0.01 mol) of 2,2-TFDB was dissolved in DMAc to prepare a solution, and then this solution was maintained at 0° C. Then, 0.88266 g (0.003 mol) of BPDA was added to the solution and stirred for 1 hour to completely dissolve BPDA, and then 1.33275 g (0.003 mol) of 6FDA was added and completely dissolved. Then, 0.8121 g (0.004 mol) of TPC was added to the resultant solution to obtain a polyamic acid solution having a solid content of 15 wt %.

A plastic substrate film was formed in the same manner as in Example 1 using the obtained polyamic acid solution.

The thicknesses of the polyimide film, hard coating layer and ITO electrode layer obtained in Example 4 are summarized in Table 1 below.

Example 5

A polyamic acid solution was prepared in the same manner as in Example 1, except that 6FCDA (9,9-bis(trifluoromethyl)-2,3,6,7-xanthene tetracarboxyl dianhydride) was used as a composition for preparing the same instead of 6FDA. Then, a plastic substrate film was formed using the prepared polyamic acid solution in the same manner as in Example 1.

The thicknesses of the polyimide film, hard coating layer and ITO electrode layer obtained in Example 5 are summarized in Table 1 below.

Comparative Example 1

As a reactor, a 100 mL 3-neck round-bottom flask provided with a stirrer, a nitrogen injector, a dropping funnel, a temperature controller and a cooler was filled with 28.78 g of N,N-dimethylacetamide (DMAc) while supplying nitrogen, and then cooled to 0° C., and then 3.2023 g (0.01 mol) of 2,2-TFDB was dissolved in DMAc to prepare a solution, and then this solution was maintained at 0° C. Then, 0.88266 g (0.003 mol) of BPDA was added to the solution and stirred for 1 hour to completely dissolve BPDA, and then 3.10975 g (0.007 mol) of 6FDA was added and completely dissolved. In this case, the concentration of solid matter in the resultant solution was 20 wt %. Thereafter, this solution was stirred at room temperature for 8 hours to obtain a polyamic acid solution having a solution viscosity of 2100 poise at 23° C.

Subsequently, 2~4 equivalents of acetic anhydride (acetic oxide, manufactured by Samjeon Co., Ltd.), as a curing agent, and 2~4 equivalents of pyridine (manufactured by Samjeon Co., Ltd.) were added to the polyamic acid solution, and then this polyamic acid solution was heated in a temperature range of 20~180° C. at a heating rate of 10° C./min for 1~10 hours to imidize the polyamic acid solution. Then, 30 g of this imidized solution was mixed with 300 g of a nonpolar solvent such as water or alcohol (methanol, ethanol or the like) and then precipitated to obtain a solid precipitate. Then, the solid precipitate was filtered and pulverized to be finely powdered, and then the finely-powdered precipitate was dried in a vacuum oven at 80~100° C. for 6 hours to obtain about 8 g of solid polyimide resin powder. The obtained solid polyimide resin powder was dissolved in 32 g of a polymerization solvent such as DMAc or DMF to obtain a polyimide solution. This polyimide solution was heated in a temperature range of 40~400° C. at a heating rate of 10° C./min for 1~8 hours to obtain a polyimide film having a thickness of 100 μm.

Comparative Example 2

A plastic substrate was manufactured in the same manner as in Example 1, except that a hard coating layer was not formed.

Comparative Example 3

A PET film, which is used as a substrate film for touch screen panels, was formed.

The physical properties of the plastic substrate films prepared in Examples 1 to 5 and Comparative Examples 1 to 3 were measured as follows, and the results thereof are summarized in Table 1 below.

(1) Coefficient of Linear Expansion (CTE)

The linear expansion coefficient of each of the prepared polyimide films was measured at 50~250° C. using a thermo-mechanical analyzer (TMA) (Q400, manufactured by TA Instrument Corporation).

Specimen size: 20 mm×4 mm

Temperature: room temperature (30° C.)~250° C., heating rate: 10/min

Load: 10 g (weight of a pendulum hanging on specimen)

(2) Yellowness

The yellowness of each of the prepared polyimide films was measured using a UV spectrometer (Cary 100, manufactured by Varian Corporation) based on ASTM E313 standard.

(3) Transmittance

The visible light transmittance of each of the prepared polyimide films was measured using a UV spectrometer (Cary 100, manufactured by Varian Corporation).

(4) Surface Hardness

The surface hardness of each of the prepared films was measured using a pencil hardness meter based on ASTM D3363 standard under the condition that a pencil was pressed and moved on each of the polyimide films at a load of 1 Kg and an inclination of 45°.

(5) Surface Resistance

The surface resistance of each of the prepared films was measured ten times using a resistance meter (CMT-SR 2000N (Advanced Instrument Technology (AIT) Corporation), 4-Point Probe System, measuring range: $10 \times 10^{-3}$~$10 \times 10^5$), and the average resistance value thereof was calculated.

TABLE 1

| Class. | Composition | Molar ratio | Thickess of polyimide film (μm) | Thickness of H/C layer (μm) | Thickness of electrode layer (nm) | Transmittance of polyimide film (550 nm) | ITO process temperature (° C.) | CTE of polyimide film (ppm/° C.) | Yellowness of polyimide film | Surface hardness | Surface resistance (Ω/sq.) |
|---|---|---|---|---|---|---|---|---|---|---|---|
| Ex. 1 | 6FDA + BPDA/ 2,2-TFDB | 7:3:10 | 100 | 5 | 100 | 87.51 | 100 | 17.22 | 2.78 | 5 | 30 |
| Ex. 2 | 6FDA + BPDA/ 2,2-TFDB | 7:3:10 | 100 | 30 | 100 | 86.81 | 150 | 17.22 | 2.82 | 9 | 21 |
| Ex. 3 | 6FDA + BPDA/ 2,2-TFDB | 7:3:10 | 100 | 30 | 100 | 85.43 | 250 | 17.22 | 3.01 | 9 | 13 |
| Ex. 4 | (6FDA + BPDA + TPC/2,2-TFDB) | 3:3:4:10 | 100 | 25 | 100 | 87.1 | 100 | 14.75 | 4.56 | 9 | 28 |
| Ex. 5 | (6FDA + BPDA + TPC/2,2-TFDB) | 3:3:4:10 | 102 | 25 | 100 | 86.4 | 100 | 15.68 | 4.35 | 8 | 30 |
| Comp. Ex. 1 | 6FDA + BPDA/ 2,2-TFDB | 7:3:10 | 100 | — | — | 88.71 | — | 17.22 | 2.66 | 3 | — |
| Comp. | 6FDA + BPDA/ 2,2-TFDB | 7:3:10 | 100 | — | ITO | 83.60 | 25 | 17.22 | 3.26 | 3 | 55 |

TABLE 1-continued

| Class. | Composition | Molar ratio | Thickess of polyimide film (μm) | Thickness of H/C layer (μm) | Thickness of electrode layer (nm) | Transmittance of polyimide film (550 nm) | ITO process temperature (° C.) | CTE of polyimide film (ppm/° C.) | Yellowness of polyimide film | Surface hardness | Surface resistance (Ω/sq.) |
|---|---|---|---|---|---|---|---|---|---|---|---|
| Ex. 2 | 2,2-TFDB | | | | 100 nm | | | | | | |
| Comp. Ex. 2 | PET | — | 188 | 50 | 20 | 88.55 | 25 | — | 1.98 | H | 260 |

From the results of Table 1 above, it can be ascertained that each of the plastic substrates of Examples 1 to 3, each including a polyimide film, a hard coating layer and a transparent electrode layer, maintains transparency and exhibits excellent surface hardness. Further, it can be ascertained that each of the plastic substrates of Examples 1 to 3 is stable at an ITO process temperature of 250° C. or lower. That is, it can be ascertained that each of the plastic substrates of Examples 1 to 3 exhibits good results in yellowness even at such high temperature. In contrast, it can be ascertained that a PET film, which is used as a conventional plastic substrate for transparent electrodes, causes yellowing at a process temperature of about 100° C., and has an excessively high surface resistance value when it is applied as an electrode substrate.

The surface resistance of the plastic substrate is influenced by the thickness of an electrode layer or by the process temperature at the time of forming the electrode layer. According to Examples 1 to 5, it can be ascertained that, when electrode layers having the same thickness are formed, surface resistance becomes low with the increase in process temperature. From the results, it can be ascertained that, according to the plastic substrate of the present invention, a process of forming a transparent electrode layer can be performed under high temperature, thus lowering surface resistance.

The invention claimed is:

1. A plastic substrate, comprising:
a polyimide film including a polyimide resin which is obtained by copolymerizing monomers comprising an aromatic dianhydride, an aromatic dicarbonyl compounds and an aromatic diamine, wherein the polyimide resin comprises a unit structure derived from the aromatic dianhydride, a unit structure derived from the aromatic dicarbonyl compound, and a unit structure derived from the aromatic diamine; and wherein the polyimide film has a yellowness of 5 or less and satisfying a light transmittance of 80% or more at a wavelength of 550 nm, measured by a UV spectrometer;
a first hard coating layer formed on one side of the polyimide film; and
a transparent electrode layer formed on the other side of the polyimide film.

2. The plastic substrate of claim 1, wherein the first hard coating layer includes a polysilazane or silica, and an acrylic resin or polyurethane resin.

3. The plastic substrate of claim 1, wherein the transparent electrode layer includes at least one selected from the group consisting of ITO, IZO, Ag and Ag nanowire.

4. The plastic substrate of claim 1, wherein the polyimide film is surface-modified.

5. The plastic substrate of claim 4, wherein the surface modification of the polyimide film is conducted by plasma treatment or corona treatment.

6. The plastic substrate of claim 1, further comprising: an inorganic layer formed between the polyimide film and the transparent electrode layer, wherein the inorganic layer contains at least one selected from the group consisting of silicon oxide and silicon nitride.

7. The plastic substrate of claim 1, further comprising: a first organic layer formed on at least one side of the transparent electrode layer, wherein the organic layer is a cured layer of an active energy ray-curable composition including: polyurethane (meth)acrylate obtained by reacting a (meth)acrylate compound containing (meth)acrylate having one hydroxyl group in one molecule thereof; and a compound having one (meth)acryloyl group.

8. The plastic substrate of claim 1, further comprising: a second organic layer formed on the hard coating layer, wherein the organic layer is a cured layer of an active energy ray-curable composition including: polyurethane (meth)acrylate obtained by reacting a (meth)acrylate compound containing (meth)acrylate having one hydroxyl group in one molecule thereof; and a compound having one (meth)acryloyl group.

9. The plastic substrate of claim 1, further comprising: a second hard coating layer formed between the polyimide film and the transparent electrode layer.

10. The plastic substrate of claim 1, wherein the first hard coating layer has a thickness of 1-50 μm.

11. The plastic substrate of claim 1, wherein the transparent electrode layer has a thickness of 1-100 nm.

12. The plastic substrate of claim 7, wherein the first organic layer has a thickness of 1-10 μm.

13. The plastic substrate of claim 6, wherein the inorganic layer has a thickness of 1-100 nm.

14. The plastic substrate of claim 1, wherein the polyimide resin comprises: a unit structure derived from at least one aromatic dianhydride selected from the group consisting of 2,2-bis(3,4-dicarboxyphenyl)hexafluoropropane dianhydride, 4-(2,5-dioxotetrahydrofuran-3-yl)-1,2,3,4-tetrahydronaphthalene-1,2-dicarboxylic anhydride, 9,9-bis(trifluoromethyl)-2,3,6,7-xanthene tetracarboxyl dianhydride and 4,4'-(4,4'-isoproylidenediphenoxy)bis(phthalic anhydride), a unit structure derived from at least one aromatic dianhydride selected from the group consisting of pyromellitic dianhydride, biphenyltetracarboxylic dianhydride and oxydiphthalic dianhydride; a unit structure derived from at least one aromatic diamine selected from the group consisting of 2,2-bis[4-(4-aminophenoxy)-phenyl]propane, 2,2'-bis(trifluoromethyl)-4,4'-diaminobiphenyl, 3,3'-bis(trifluoromethyl)-4,4'-diaminobiphenyl, 4,4'-bis(3-aminophenoxy)diphenylsulfone, bis(3-aminophenyl)sulfone, bis(4-aminophenyl)sulfone, 1,3-bis(3-aminophenoxy)benzene, 1,4-bis(4-aminophenoxy)benzene, 2,2'-bis[3(3-aminophenoxy)phenyl]hexafluoropropane, 2,2'-bis[4(4-aminophenoxy)phenyl]hexafluoropropane, 2,2'-bis(3-aminophenyl) hexafluoropropane (3,3'-6F), 2,2'-bis(4-aminophenyl) hexafluoropropane (4,4'-6F) and oxydianiline; and a unit structure derived from at least one aromatic dicarbonyl compound selected from the group consisting of p-terephthaloyl chloride, terephthalic acid, iso-phthaloyl dichloride and 4,4'-benzoyl chloride.

15. The plastic substrate of claim 1, wherein the polyimide film has an average linear expansion coefficient of 30.0 ppm/° C. or less, which was measured at a temperature range of 50-250° C. by thermo-mechanical analysis based on a thickness of 50-200 μm.

16. The plastic substrate of claim 1, wherein the plastic substrate has a surface resistance of 50 Ω/sq. or less, when a thickness of the transparent electrode layer is 100 nm.

17. A method of manufacturing a plastic substrate, comprising the steps of:

forming a hard coating layer on one side of a polyimide film including imides of polyimide resin precursors prepared by a polymerization of aromatic dianhydrides, aromatic dicarbonyl compounds and aromatic dimaines, having a yellowness of 5 or less, and satisfying a light transmittance of 80% or more at a wavelength of 550 nm, as measured by a UV spectrometer; and forming a transparent electrode layer on the other side of the polyimide film, wherein the step of forming the transparent electrode layer includes a step of depositing the transparent electrode layer on the other side of the polyimide film and heat-treating the deposited transparent electrode layer, wherein the deposition or heat treatment is performed at 100 to 250° C.

18. A touch screen panel, comprising the plastic substrate of claim 1.

19. The plastic substrate of claim 9, wherein the hard coating layer has a thickness of 1-50 μm.

20. The plastic substrate of claim 8, wherein the organic layer has a thickness of 1-10 μm.

21. The plastic substrate of claim 9, wherein the second hard coating layer has a thickness of 1-50 μm.

22. The plastic substrate of claim 8, wherein the organic layer has a thickness of 1-10 μm.

* * * * *